United States Patent [19]
McHugh et al.

[11] Patent Number: 5,688,140
[45] Date of Patent: Nov. 18, 1997

[54] CHIP CARRIER SOCKET

[75] Inventors: Robert G. McHugh, Evergreen, Colo.; Ching-ho Lai, Tao-Yuan Hsien; Cherng-Horng Lin, Taipei Hsien, both of Taiwan

[73] Assignee: Hon Hai Precision Ind. Co., Ltd., Taipei, Taiwan

[21] Appl. No.: 580,172

[22] Filed: Dec. 28, 1995

[51] Int. Cl.⁶ .................................................. H01R 4/50
[52] U.S. Cl. .................................. 439/342; 439/331
[58] Field of Search ........................... 439/259–270, 439/59, 72, 73, 330, 331, 342

[56] References Cited

U.S. PATENT DOCUMENTS

| | | | |
|---|---|---|---|
| 4,976,629 | 12/1990 | Werner | 439/259 |
| 5,320,552 | 6/1994 | Reichardt et al. | 439/331 |
| 5,364,286 | 11/1994 | Matsuoka | 439/331 X |
| 5,415,559 | 5/1995 | Ichimura | 439/342 X |
| 5,452,183 | 9/1995 | Renn et al. | 439/331 X |
| 5,482,471 | 1/1996 | Mori et al. | 439/331 X |

Primary Examiner—Khiem Nguyen

[57] ABSTRACT

A chip carrier socket (10) for use with the LGA chip (110), includes a base (12) having an internal cavity (15) for receiving therein a cover (14) hinged to the base (12) whereby the LGA chip (110) may be sandwiched between the cover (14) and the base (12). A plurality of passageways (22) are formed in the base (12) in a vertical direction for receiving a corresponding number of contacts (100) therein. The cover (14) is moved with regard to the base (12) in both vertical and horizontal directions so that when the socket (10) is in a closed state, the contacts (100) of the socket (10) may abut against the corresponding landing plates (112) disposed on the undersurface of the LGA chip (110) for interconnection.

19 Claims, 9 Drawing Sheets

CHIP CARRIER SOCKET

BACKGROUND OF THE INVENTION

1. Field of The Invention

The invention relates to chip carrier sockets for use with LGA (Land Grid Array) Components, and particularly to the socket which actuates the internal chip to move in not only the horizontal direction but also the vertical direction whereby the chip may have a reliable electrical and mechanical engagement with the contacts of the socket.

2. The Prior Art

PGA (Pin Grid Array) chips are popularly used in the computer industry, and the PGA sockets are also applied thereto and mounted on the mother boards for receiving such PGA chips therein, for example, U.S. Pat. No. 5,456,613. Because the traditional PGA chip needs to connect and wire the respective pins to the internal circuits, such packaging of the chip itself may cost money and take too much space. In general, a PGA chip after packaging procedure such as wiring and bonding, takes four times space in comparison with its internal raw chip set. In addition, the long pins extending from PGA chip needs a good container to enclose it for not being damaged during shipping and handling. Moreover, the pins results in longer circuit paths and/or larger electrical resistance and thus leads inferior electrical performance especially during high speed signal transmission. Therefore, in the recent years, a BGA (Ball Grid Array) design has been introduced which directly adheres a ball-like electrode under each respective circuit to replace the long and dispersed pins of the PGA chip. Thus the final package of BGA chip may only take one third of the space of the PGA chip.

U.S. Pat. No. 5,419,710 discloses a socket which cooperates with the BGA chip. Recently, an LGA (Land Grid Array) chip has been proposed wherein the ball-like electrodes of the BGA chip are replace by plate-type plates for simplifying the fabrication and reducing the height of the chip. U.S. Pat. Nos. 5,192,213, 5,199,889, 5,232,372, 5,320, 559, 5,362,241 and 5,389,819 generally disclose some types of the device which incorporates LGA chip on the mother board, and the invention also teaches a different structural socket for receiving the LGA chip therein on the mother board.

SUMMARY OF THE INVENTION

A chip carrier socket for use with the LGA chip, includes an base having an internal cavity for receiving therein a cover hinged to the base whereby the LGA chip may be sandwiched between the cover and the base. A plurality of passageways are formed in the base in a vertical direction for receiving a corresponding number of contacts therein. The cover is moved with regard to the base in both vertical and horizontal directions so that when the socket is in a closed state, the contacts of the socket may abut against the corresponding landing plates disposed on the undersurface of the LGA chip for interconnection. Additionally, the base further includes guidance means to cooperate with the cover for guiding movements of the cover with regard to the base. Yet, the socket includes a lever having operation bar and camming shaft for actuating the cover to move regard to the base.

DETAILED DESCRIPTION OF THE PREFERRED EMBODIMENT

References will now be made in detail to the preferred embodiments of the invention. While the present invention has been described with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 1:
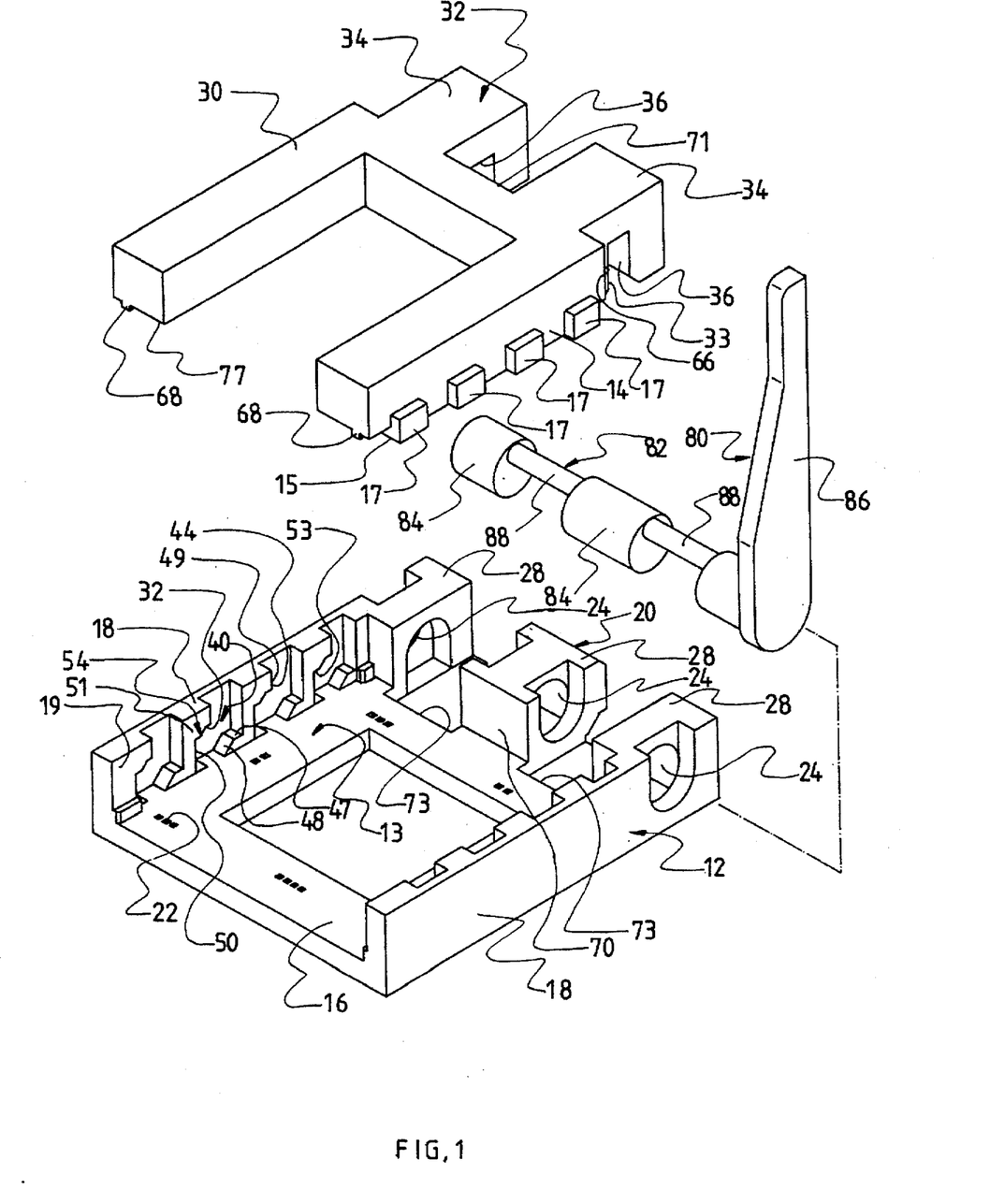
FIG. 1 is an exploded perspective view of a presently preferred embodiment of a LGA socket without contacts therein according to the invention.
Figure 6:
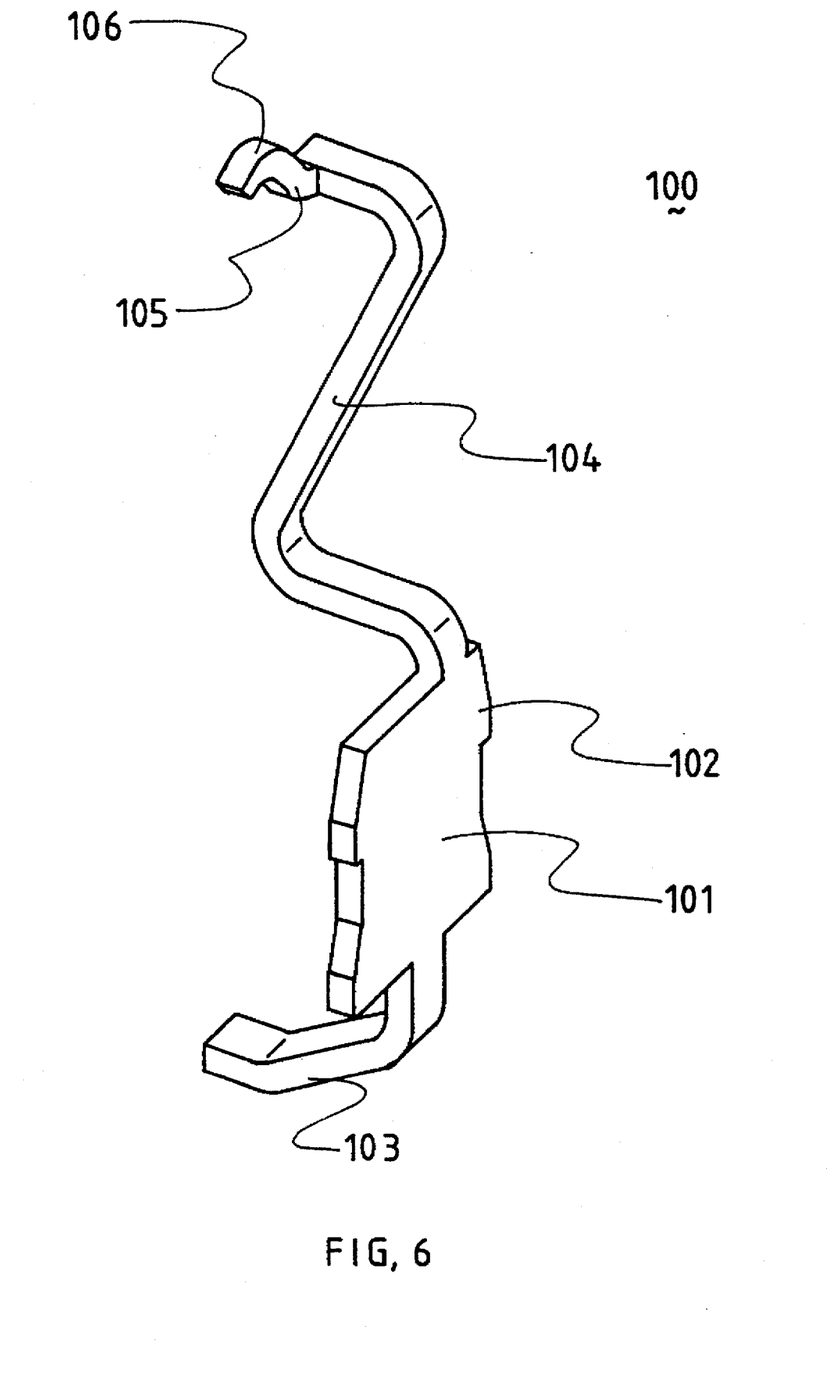
FIG. 6 is a contact for within the socket of FIG. 1.

It will be noted here that for a better understanding, most of like components are designated by like reference numerals throughout the various figures in the embodiments. Attention is directed to FIG. 1, wherein a chip carrier socket 10 includes a base 12 and a cover 14 hinged on the base 12. The base 12 comprises a bottom plate 16 having two opposite side walls 18 on two sides and a nest section 20 on the rear portion commonly defining a cavity 13 therein above the bottom plate 16. A plurality of passageways 22 side by side extend vertically through the bottom plate 16 for receiving therein a corresponding number of contacts 100 as shown in FIG. 6.

The nest section 20 includes three spaced mounting seats 28 respectively defining three coaxial round holes 24 for respectively receiving three supporting sections 84 of a camming shaft 82 of a lever 80. The lever 80 also includes an operating bar 86 integrally and perpendicularly jointed with one end of the camming shaft 82 and exposed by one side wall 18 for easy access and operation in an exterior. The camming shaft 82 further includes two camming sections 88 each positioned between two adjacent supporting sections 84 of the camming shaft 82.

Figure 1A:
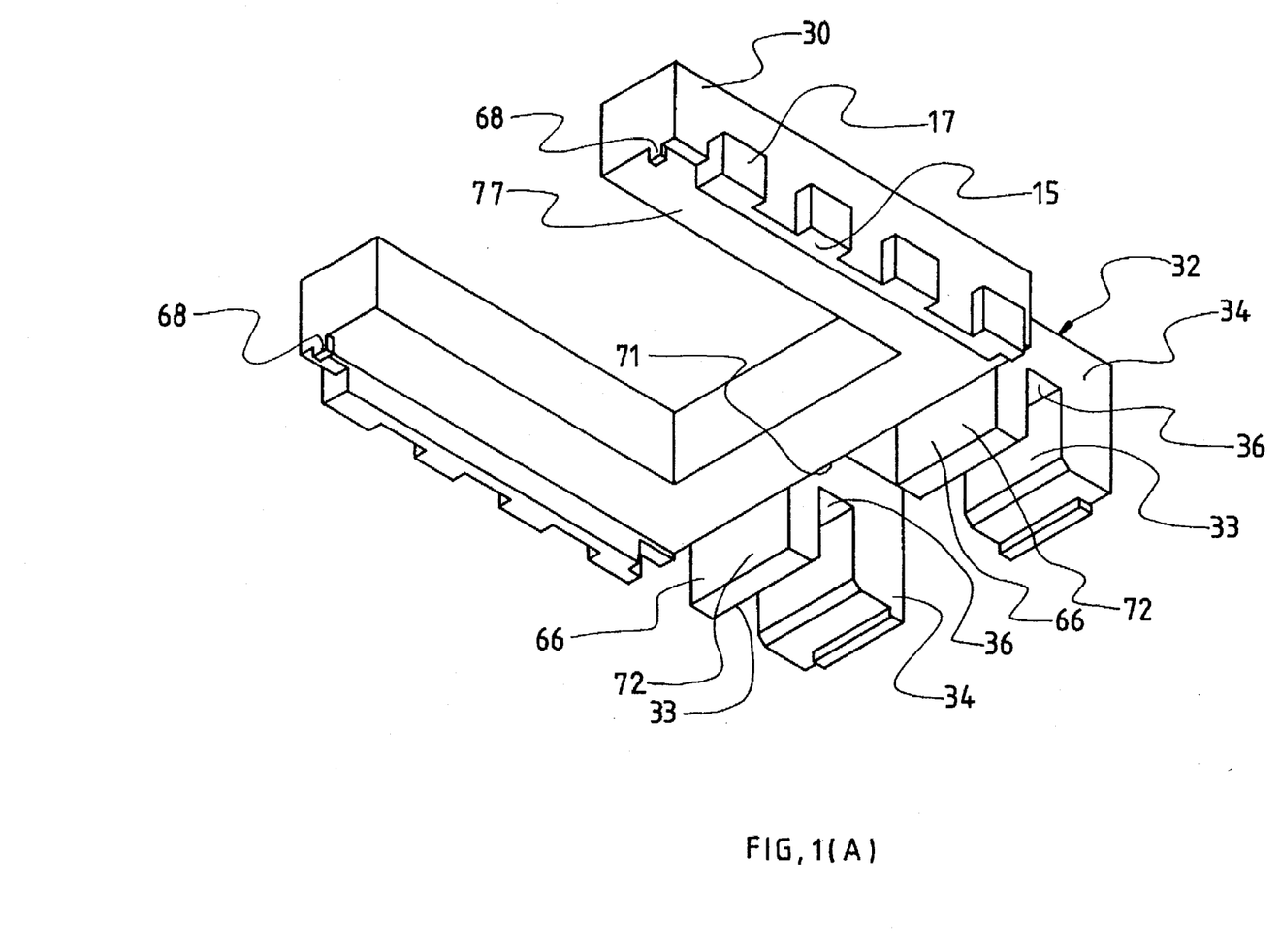
FIG. 1(A) is a bottom perspective view of the cover of the socket of FIG. 1 to show underside structure thereof.
Figure 2A:
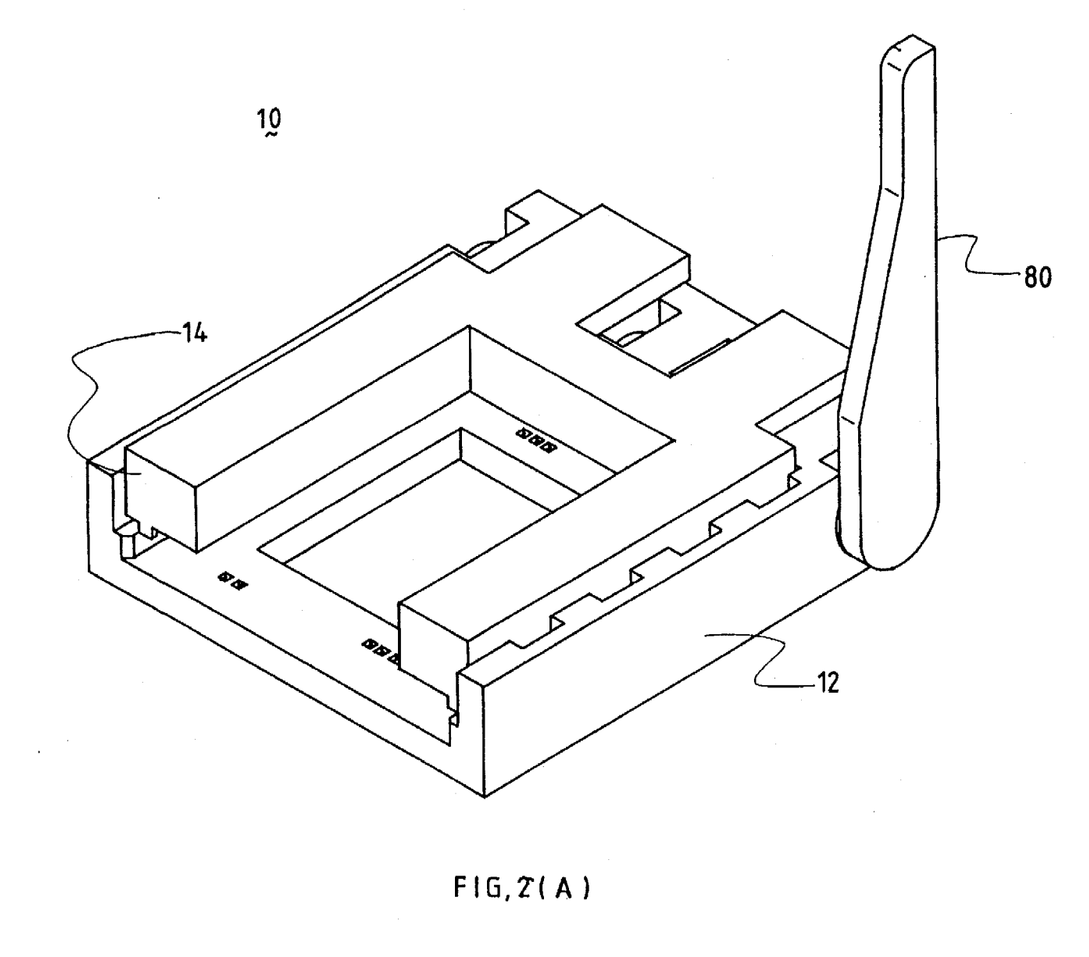
FIG. 2(A) is a perspective view of an assembled LGA socket of FIG. 1 in an open state.
Figure 2B:
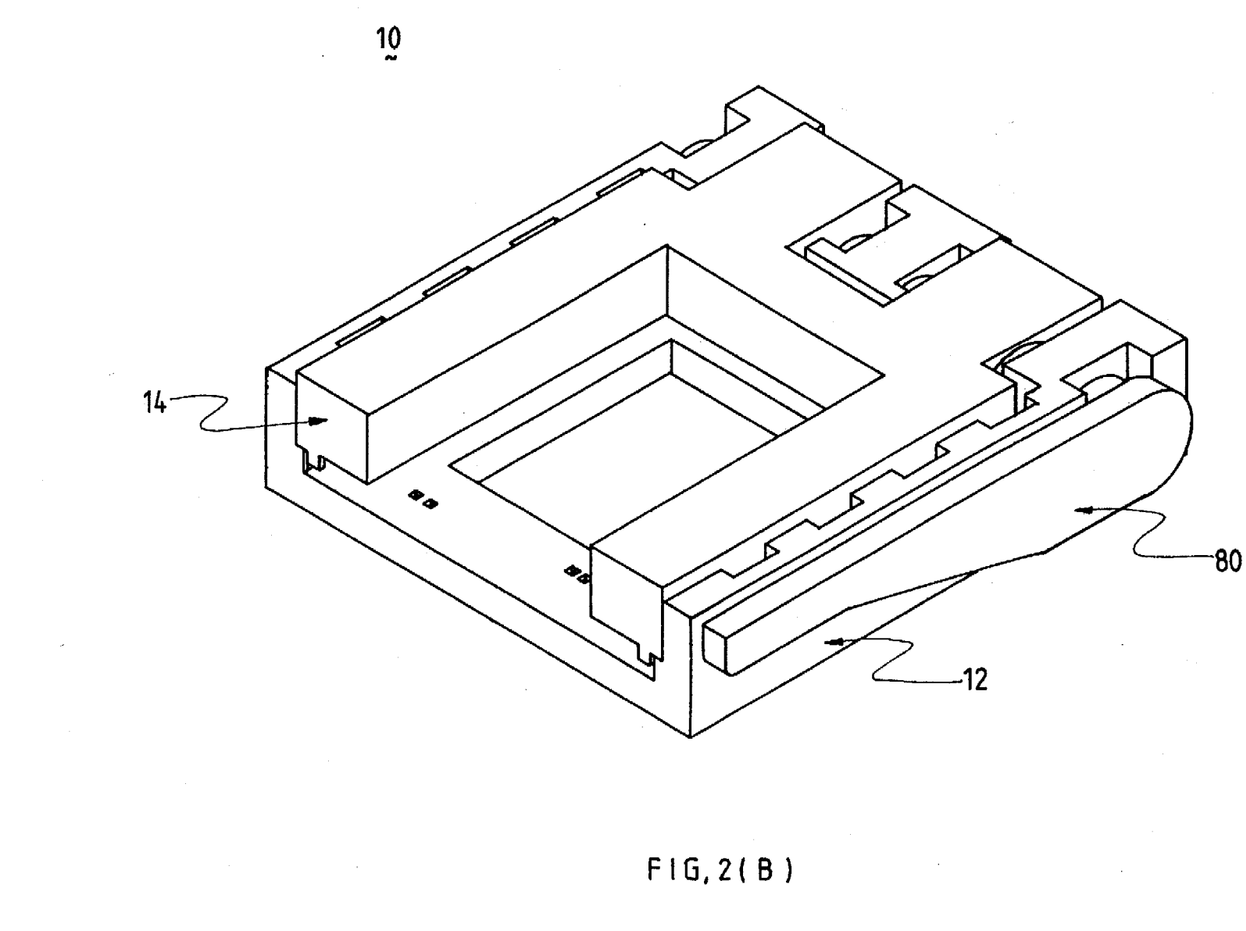
FIG. 2(B) is a perspective view of an assembled LGA socket of FIG. 1 in a closed state.
Figure 3A:
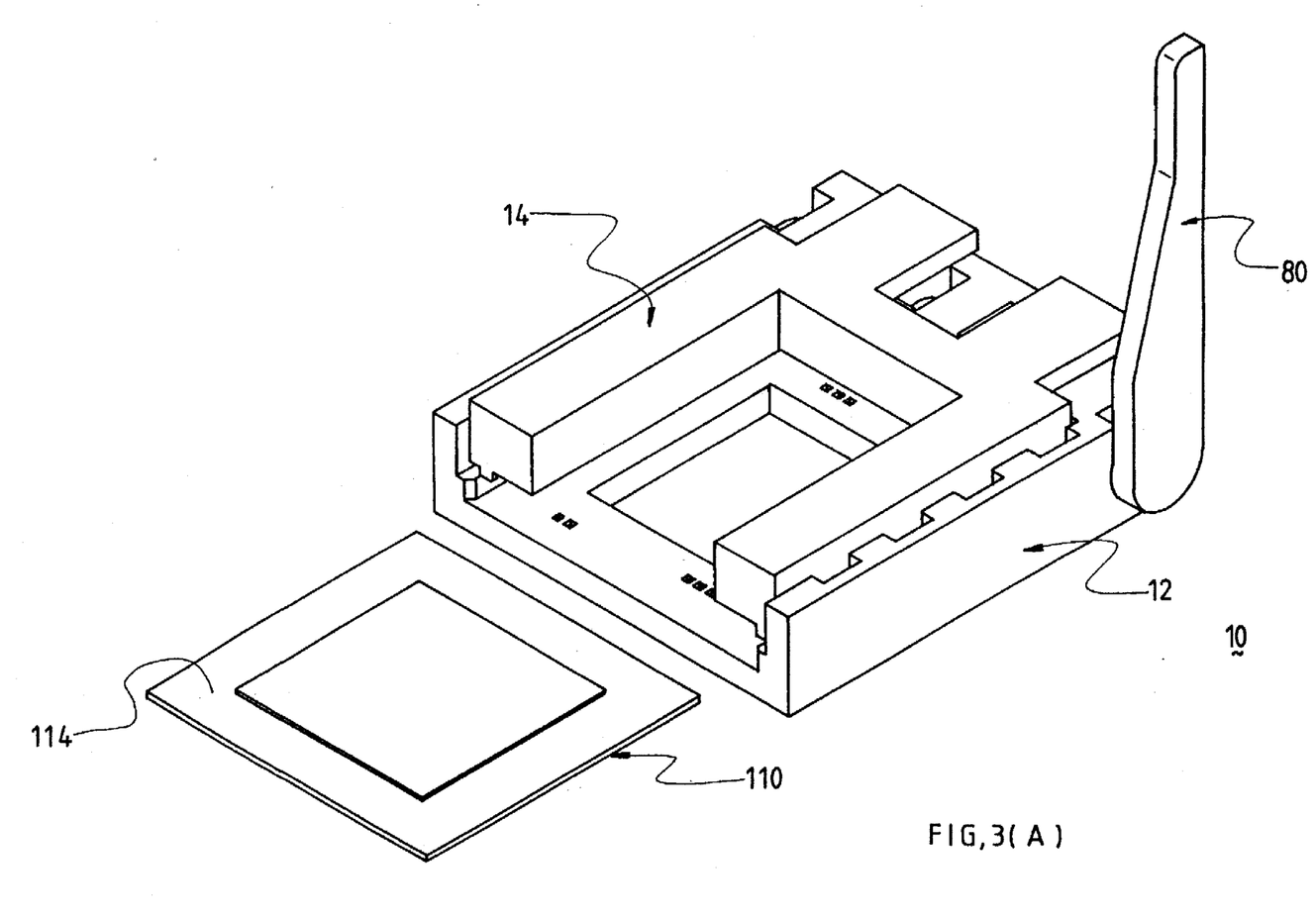
FIG. 3(A) is a perspective view of the assembled LGA socket of FIG. 1 in an open state for being ready to allow a LGA chip to be inserted therein.
Figure 3B:
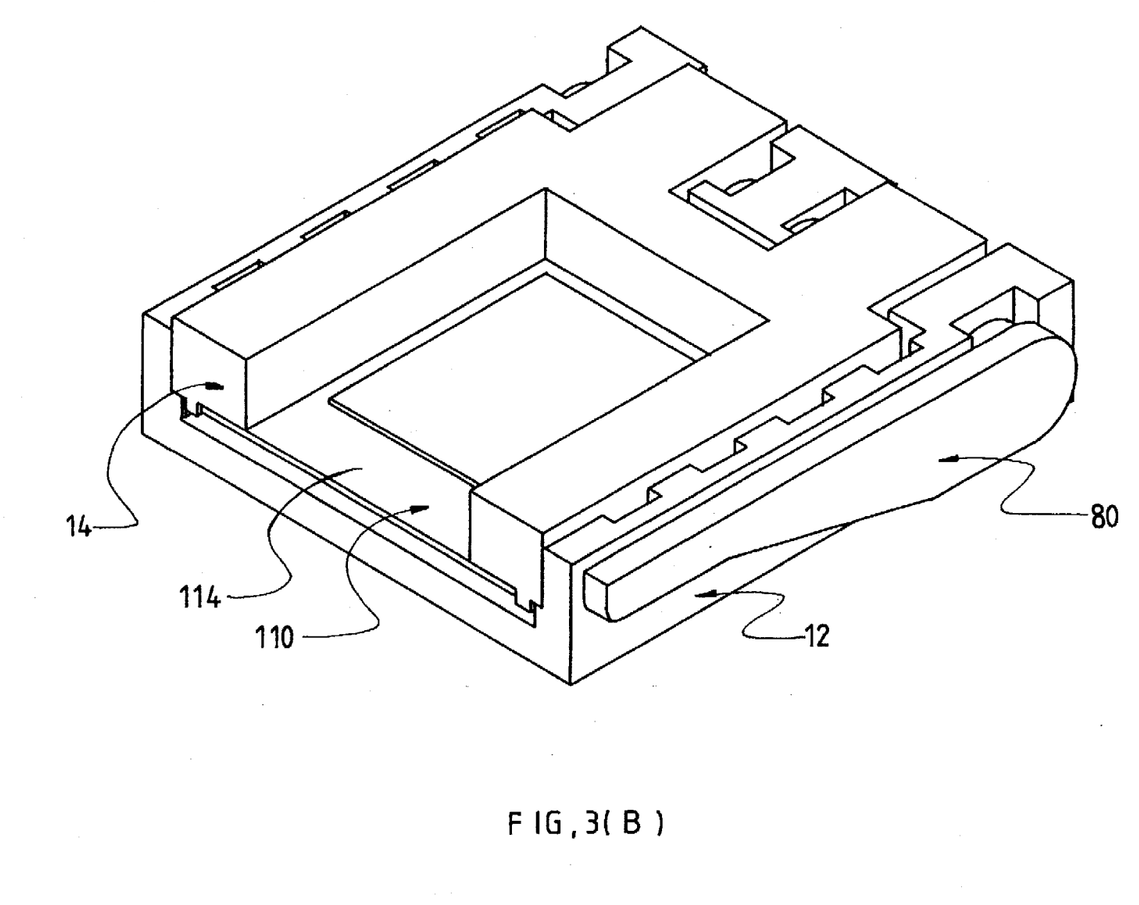
FIG. 3(B) is a perspective view of the assembled LGA socket of FIG. 1 in a closed state having the LGA chip inserted therein.

Also referring to FIG.1(A), the cover 14 generally having the similar shape with the base 12 includes a pressing portion 30 and a hinge portion 32 wherein the pressing portion 30 is adapted to be received within the cavity 13 and the hinge portion 32 generally comprises a pair of U-shaped holding pockets 34 which can be respectively snugly received between every two adjacent mounting seats 28 of the base 12. It can be seen that the width of a slot 36 formed within the U-shaped pocket 34 is generally equal to or a little bit larger than the diameter of the camming section 88 of the camming shaft 82 of the lever 80 whereby the cover 14 can be sensitively actuated to correspondingly move when the camming sections 88, which are engaged within the corresponding slots 36, are swung with regard to the axis of the supporting sections 84 of the camming shaft 82.

The cover 14 includes several engaging blocks 17 on two opposite sides. Correspondingly, each side wall 18 includes several channels 40 disposed on an interior surface 19 wherein each channel 40 comprises two opposite defining surface 42 and 44. The first defining surface 42 includes a vertical surface 46 terminating at a horizontal surface 47, and a slope surface 48 extending from the distal end of the horizontal surface 47. Correspondingly, the second defining surface 44 includes a first vertical surface 49 on the upper portion and a second vertical surface 50 on the lower portion, and an intermediate surface 51 positioned therebetween wherein such intermediate surface 51 further comprises a first horizontal surface 52 and a second horizontal surface 53 having a slope surface 54 intermediating therebetween. The horizontal surface 47, the slope surface 48 of the first defining surface 42 plus the corresponding bottom plate 16 of the base 12, may cooperate with the first horizontal surface 52, the slope surface 54, the second horizontal surface 53 and the second vertical surface 50 of the second defining surface 44, for forming the functional guidance rail for receivably retaining the corresponding engaging block 17 of the cover 14 and guidably having such engaging block 17 move along the path formed thereof.

When assembled, first the camming shaft 82 of the lever 80 is inserted into the nest section 20 of the base 12 wherein each supporting section 84 is properly embedded within the hole 24 of the corresponding mounting seat 28. Successively, under the condition that the operating bar 86 of the lever 80 is in an upright position, the cover 14 is loaded onto the base 12 from the top whereby each of the holding pocket 34 may be positioned between every two adjacent mounting seats 28 and appropriately holding the corresponding camming section 88 within its slot 36. At the same time, each engaging block 17 may be aligned with the corresponding channel 40, respectively, and downward moved along the path defined between the vertical surface 46 of the first defining surface 42 and the first vertical surface 49 of the second defining surface 44 of the corresponding channel 40 until the bottom surface 15 of each engaging block 17 butts the bottom plate 16 of the base. Because the holding pocket 34 designedly forms a little converged narrowed opening 33 with regard to the other portions of the slot 36, the cover 14 can not be inadvertently upward removed from the base 12 after the camming section 88 has been in depth embedded within the innermost end of the slot 36. Also, the pockets 34 will confront the supporting sections 84 laterally, thus prohibiting the camming shaft 82 from moving axially.

Figure 4A:
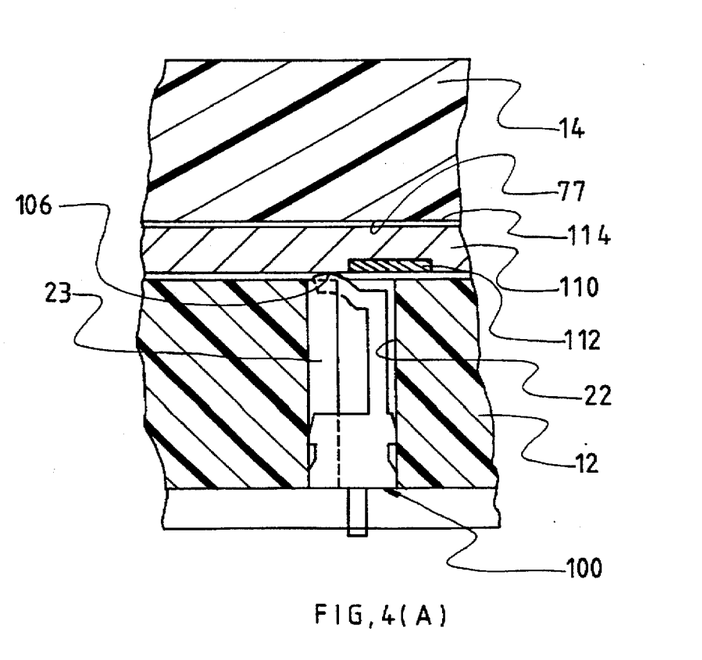
FIG. 4(A) is an enlarged partial cross-sectional view of the socket of FIG. 1 and the chip therein to show the relationship between the contact and the corresponding land plate of the LGA chip when the socket is in an open state.
Figure 4B:
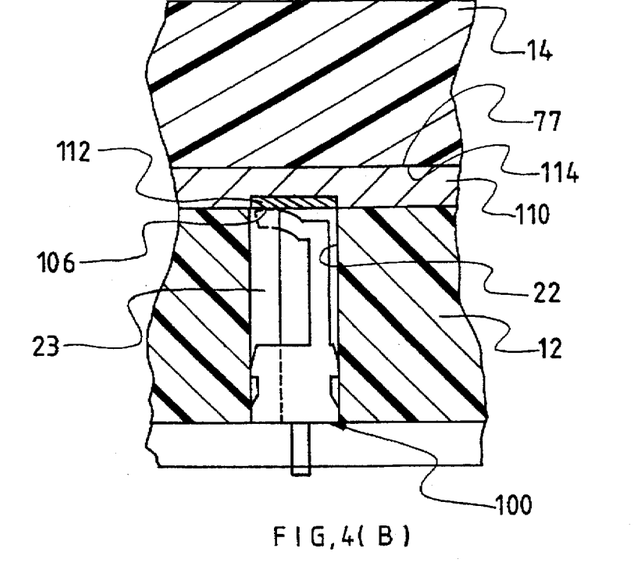
FIG. 4(B) is an enlarged partial cross-sectional view of the socket of FIG. 1 and the chip therein of to show the relationship between the contact and the corresponding land plate of the LGA chip when the socket is in a closed state.

Regarding operation of the socket 10, referring to FIGS. 2(A), 2(B), 3(A), 3(B), 4(A), 4(B) and 5, when the socket 10 is in an open state, the operating bar 86 is in a vertical position. Because the camming sections 88 are substantially snugly received within the corresponding slots 36 of the pockets 34 of the cover 14, the cover 14 is actuated to be in a rear position with regard to the base 12. In this situation, referring to FIG. 5, the lower corner 60 of the engaging block 17 may be seated on the horizontal surface 47 of the first defining surface 42 of the channel 40. Thus, the cover 14 is in a high position as shown in FIG.4(A), i.e., the position which keeps the cover spaced from the bottom plate 16 in a substantial distance for allowing a LGA chip 110 to be inserted into the space formed therebetween freely.

Figure 5:
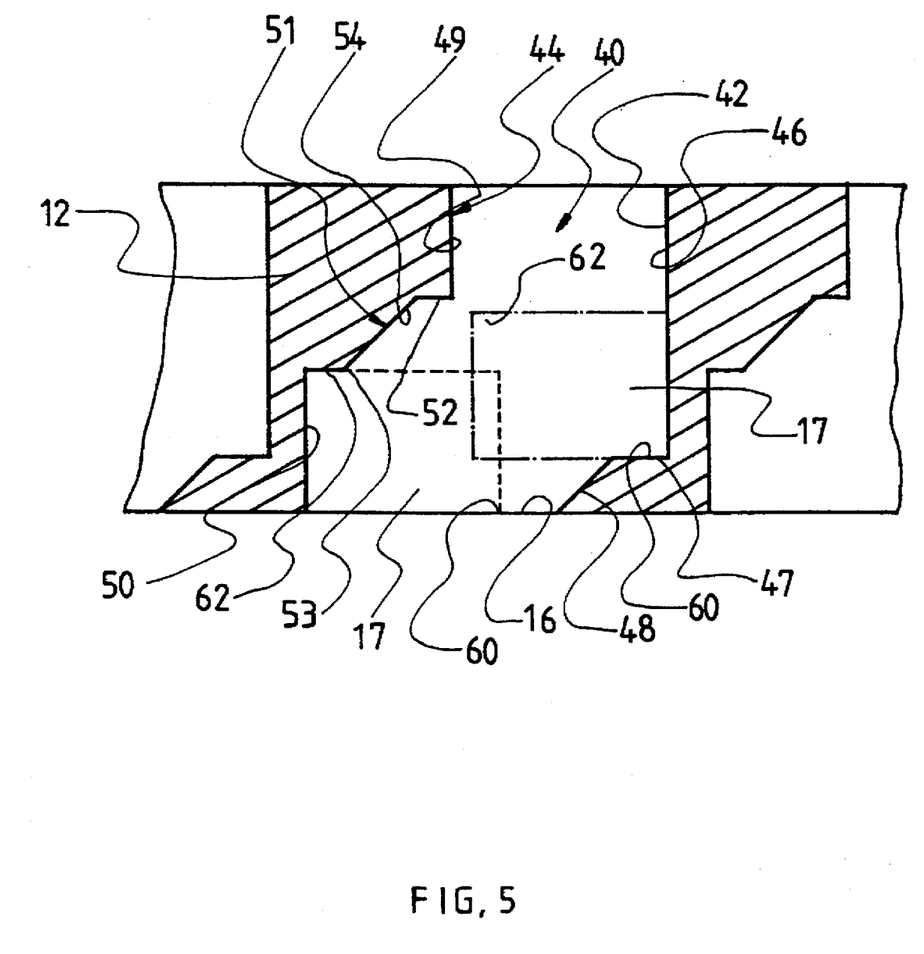
FIG. 5 is an enlarged partial plan view of the socket of FIG. 1 to show how the engaging block of the cover is moved within and along the corresponding channel of the base whereby the cover can be guided to move up and down with regard to the base.

Successively, after insertion of the LGA 110 chip into the socket 10, the operating bar 86 is rotatably moved downward from the vertical position to the horizontal position. Therefore, the camming sections 88 of the camming shaft 82 may actuate the corresponding holding pockets 34 to move forward with regard to the base 12. During this process, the engaging blocks 17 of the cover 12 can not help but move along the paths of the channels 40. In other words, as shown in FIG. 5, the upper corner 62 of the engaging block 17 may confront the slope surface 54 of the second defining surface 44 and be forced to continuously move along such slope surface 54. Therefore, the moveable engagement of the engaging blocks 17 within the corresponding paths of the channels 40 result in the cover 14 being moved forward and downward. When the operating bar 86 is rotated to its final horizontal position, the engaging block 17 may be almost seated on the bottom plate 16 wherein the upper corner 62 substantially confront the second horizontal surface 53 of the second defining surface 44, thus assuring the cover 14 can not be inadvertently upward moved with regard to the base 12.

During downward rotation of the operating bar 86 and downward and forward movement of the cover 14, the LGA chip 110 which first confront a first restraining portion 66 of the pocket 34 of the cover 16, and soon will be grasped by and embedded between the first restraining portion 66 and the second restraining portion 68 integrally downward formed on the cover 14 due to the gradually downward movement of the cover 14. Also, the undersurface 77 of the cover 14 does confront the top surface 114 of the chip 110. Thus, the continuous downward and forward movement of the cover 14 will simultaneously actuate the LGA chip 110 to be moved in the same pattern, i.e., downward and forward, until the operating bar 86 reaches its final horizontal position and the engaging block 17 is generally positioned at the distal end of the channel 40.

In contrast, to remove the LGA chip 110 from the socket 10, the operating bar 86 is rotated to the vertical position and the cover 14 will be actuated to move rearward due to the engagement of the camming sections 88 with the pockets 34 of the cover 14. In this situation, the lower corner 60 of the engaging block 17 will confront and move along the slope surface 48 of the first defining surface 42, and this results in rearward and upward movement of the cover 14 until the operating bar 86 is in its vertical position and the lower corner 60 substantially sit on the horizontal surface 47 of the first defining surface 42. Thus, the upward movement of the cover 14 releases the restraint of the LGA chip 110 from the restraining portions 66 and 68, and allows the chip 110 to be manually removed from the cavity 13 of the base 12 and the space between the cover 14 and the base 12.

It can be understood that with reference to FIGS. 1 and 1(A), the rear limit position of the cover 14, when the lever 80 is in a vertical position, is constrained by confrontation of the surfaces 70 on the mounting seats 28 and the surfaces 71 on the cover 14. Oppositely, the front limit position of the cover 14, when the lever 80 is in a horizontal position, is constrained by confrontation of the surfaces 72 of the cover 14 and the surfaces 73 of the base 12.

With reference to FIG. 6, the contact 100 for use within the socket 10 generally includes a main body 101 having barbs 102 thereon to be interferentially retained within the corresponding passageways 22 and pressed by the ribs 23 in the base 12. A tail 103 extends downward from the main body 101 for solderably mounting on the mother board (not shown). A Z-shape resilient section 104 extends adjacent one side of the main body 101 wherein the imaginary plane constructed by such Z-shaped section 104 is substantially perpendicular to the main body 101. An upward curved contact section 105 with an apex 106 thereon, extends from the distal end of the resilient section 104 in a direction parallel to the main body 101. In general, when the contact 100 is assembled within the base 12 of the socket 10, the apex 106 of the contact section 105 substantially protrudes out of the bottom plate 16 as shown in FIG. 4(A). Therefore, when the cover 14 associated with the inserted LGA chip 110 commonly downward and forward move toward the base 12, the gradually electrical and mechanical engagement between the contact 100 and the electrode plate 112 of the LGA chip 110 first will result in a wiping action for both chip electrode plate 112 of the chip 110 and the contact apex 106 of the contact 100 for better conductivity, and such engagement will be gradually enhanced according to the downward movement of the cover 14 to a maximum extent when the cover 14 reaches its final lowest position.

It can be understood that one feature of the invention is that the contact 100 comprises a three dimensional structure of its resilient section 104 and contact section 105 which makes it possible to create a great resiliency of a contact within a short and tiny space. The resilient section 104 extending offset from the center line of the main body 101 of the contact 100, may allow the contact section 105 to extend along the direction of and parallel to the main body 101 within the tiny passageway 22 and arrange the best resiliency thereof. This arrangement is different from most prior arts only having plane-like arrangement of the contact configuration. Moreover, different from most existing connectors which use normal forces to sandwich or engage a contact in a lateral direction, i.e., the direction of contact force being perpendicular to that of the mating, in the present invention the contact 100 of the socket 10 provides an engagement and resistance force against the chip plate 112 wherein such force is substantially along the mating direction of the chip 110 and the socket 10. Therefore, the socket of the invention, in a closed status, provides means for assuring that the chip 110 always keeps a compact and tight engagement relationship with the socket 10 without the risk of inadvertent disengagement therefrom due to the engagement/resistance force from the contact 100.

It is also noted that different from other prior art sockets which use the rotation type cover as shown in U.S. Pat. Nos. 4,220,383, 4,460,223, 4,621,884, 4,715,835 and 4,758,176, or the detachable type cover as shown in U.S. Pat. Nos. 4,349,238, 4,381,131, 4,688,870, 5,259,771 and 5,236,367, to retain chips therein, the invention discloses a cover 14 which can be vertically moved away from the base 12 to expose a wider space for insertion the chip 110 therein under a condition that the movement of such cover 14 still keeps the cover 14 in a stable horizontal state during the whole up-and-down moving of such cover 14 with regard to the base 12. This type movement takes less space than any other prior art types.

While the present invention has been described with reference to specific embodiments, the description is illustrative of the invent and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

We claim:

1. A chip carrier socket for receiving a chip carrier therein comprising:

a base having bottom plate with a plurality of passageways extending therethrough for receiving a corresponding number of contacts therein;

two side walls disposed on two sides of the bottom plate, and a nest section disposed on a rear portion, said side walls and nest section commonly defining a cavity therein;

a cover including a pressing portion adapted to be received within said cavity, and a hinge portion coaxial fastened to said nest section of the base; and means for guiding the cover to move with regard to the base in both vertical and horizontal directions under a condition that said cover always maintains in a horizontal state during movement of the cover.

2. The socket as defined in claim 1, wherein said means includes at least one channel recessed in the side wall of the base and an engaging block formed on the cover.

3. The socket as defined in claim 2, wherein said channel includes a first defining surface and a second defining surface, and said first defining surface includes an upward facing slope surface for guidance of upward movement of the cover, and said second defining surface includes a downward facing slope surface for guidance of downward movement of the cover.

4. The socket as defined in claim 3, wherein the second defining surface of said channel further includes a first horizontal surface and a second horizontal surface continuously extending from two ends of said downward facing slope surface of the second defining surface.

5. The socket as defined in claim 1, wherein said cover further includes a first and a second restraining portions commonly defining a space to properly receive said chip carrier therein for simultaneously moving the chip back and forth when said cover is moving back and forth.

6. The socket as defined in claim 1, wherein the socket further includes a lever having an operating bar exposed in an interior, and an integrally jointed camming shaft extending through the nest section of the base and the hinge portion of cover, and said camming shaft includes at least a camming section which cooperates with a holding pocket of the cover for back-and-forth movement of the cover with regard to the base.

7. The socket as defined in claim 1, wherein each of the contacts has a contact apex which substantially protrude out of the bottom plate of the base for being adapted to be engaged with a corresponding plate formed on the bottom surface of the chip.

8. A contact for use within a passageway of a chip carrier socket comprising:

a plate type main body;

a tail downward extending from the main body;

a resilient section upward extending from the main body wherein an imaginary plane constructed by said resilient section;

a contact section integrally and laterally extending from a distal end of the resilient section in a direction which is different from the elastic direction of said resilient section.

9. The contact as defined in claim 8, wherein said contact section is of a curved type having an apex thereon.

10. The contact as defined in claim 9, wherein said resilient section is substantially offset from a centerline of the main body so that the contact section can prolong to an extent in a same direction of the main body with said passageway.

11. A chip carrier socket for use with a chip carrier, comprising:

a base having a bottom plate with a plurality of contacts therein;

a cover fastened to said base and adapted to be relatively moved with regard to the base through an operation of a lever; wherein said socket includes means having at least an engaging block and a channel whereby the cover can be up and down moved with regard to the base in back-and-forth direction and under a condition that said cover always keeps in a parallel relation with the base.

12. A arrangement for loading a chip carrier into a chip carrier socket, said socket comprising:

a base including a bottom plate having a plurality of contacts therein;

a cover attached to said base but always keeping in a parallel relation with regard to the base in up and down movement to expose a wider opening allowing a chip carrier to be inserted into said socket in a horizontal direction which is parallel to said base.

13. A socket for use with a chip carrier comprising:

a base including a bottom plate having a plurality of contacts therein;

a cover attached to said base but still back and forth moveable with regard to the base; and said cover further including restraining means that carries the chip carrier to move in compliance with back-and-forth movement of said cover.

14. The socket as defined in claim 13, wherein said restraining means includes a pair of restraining portions defining a space for snugly receiving said chip carrier therein.

15. A socket for use with a chip carrier, comprising:

a base including a bottom plate with a plurality of contacts therein;

a cover attached to said base but still moveable with regard to the base; and a set of guidance means including at least a channel and a corresponding engaging block that are respectively disposed on said base and said cover and cooperate with each other wherein said channel further includes at least a upward facing slope surface and a downward facing slope surface to respectively engage with said engaging block of the cover for guiding the rearward/upward and forward/downward movements of the cover with regard to the base.

16. The socket as defined in claim 15, wherein said engaging block is substantially embedded and restrained within the corresponding channel so that the cover can not be inadvertently removed from the base.

17. A socket for use with an electrical component, comprising:

a base having a plurality of contacts therein;

a cover attached to said base for cooperating with said base; and a lever mean actuating the cover to move with regard to the base in a parallel relation and to define a space between said cover and base for receiving said electrical component;

each of said contacts having contact apex protruding out of the base and into said space to engage with a corresponding electrode disposed on a undersurface of said component that is pressed by the actuated cover.

18. An arrangement for engagement between an electrode of an electrical component and a contact of an electrical connector wherein said electrode is moved toward the contact in both vertical and horizontal directions whereby a horizontal movement of the electrical component provides a wiping action therewith and a vertical movement of said electrical component increasingly presses said electrode against the contact to have said contact deformed in the vertical direction and enhance engagement between the contact and the electrode, and also to have said contact provide an engagement force opposite to a direction of vertical movement of said electrical component.

19. A method for assembling a chip carrier socket wherein the socket comprises:

a base having nest section defining holes extending horizontally, and two side walls defining a plurality of channels therein;

a lever having a camming shaft including camming sections, and a cover having a hinge portion including pockets corresponding to the camming sections of the camming shaft of the lever, and a plurality of engaging blocks corresponding to the channels whereby assembling steps comprising:

inserting the camming shaft of the lever into the holes of the nest section of the base in a horizontal direction;

loading the cover onto the base wherein the pockets of the cover receive therein the camming sections of the camming shaft of the lever, and the engaging blocks of the cover are received within the corresponding channels in the base.

* * * * *